(12) United States Patent
Yasunaga et al.

(10) Patent No.: US 11,994,767 B2
(45) Date of Patent: May 28, 2024

(54) LIGHTING DEVICE USING WAVELENGTH CONVERSION SHEET, AND DISPLAY DEVICE USING THE SAME

(71) Applicant: SHARP KABUSHIKI KAISHA, Sakai (JP)

(72) Inventors: Hirotoshi Yasunaga, Sakai (JP); Takeshi Masuda, Sakai (JP); Hisashi Watanabe, Sakai (JP); Youzou Kyoukane, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/127,520

(22) Filed: Mar. 28, 2023

(65) Prior Publication Data

US 2023/0314872 A1 Oct. 5, 2023

(30) Foreign Application Priority Data

Mar. 30, 2022 (JP) .................................. 2022-055288

(51) Int. Cl.
*G02F 1/13357* (2006.01)
*G02F 1/1335* (2006.01)
*H01L 33/50* (2010.01)

(52) U.S. Cl.
CPC .. *G02F 1/133603* (2013.01); *G02F 1/133607* (2021.01); *H01L 33/504* (2013.01); *H01L 33/505* (2013.01)

(58) Field of Classification Search
CPC ......... G02F 1/133603; G02F 1/133607; G02F 1/133601; G02F 1/133614
See application file for complete search history.

(56) References Cited

U.S. PATENT DOCUMENTS

| | | | |
|---|---|---|---|
| 2014/0168988 A1* | 6/2014 | Petersen | H01L 33/505 362/293 |
| 2018/0269361 A1* | 9/2018 | Hayashi | H01L 33/505 |
| 2019/0221727 A1* | 7/2019 | Hayashi | H01L 33/486 |
| 2020/0209462 A1* | 7/2020 | Kasai | G02F 1/133608 |
| 2020/0319393 A1* | 10/2020 | Choi | G02B 6/005 |
| 2022/0066266 A1 | 3/2022 | Ota et al. | |
| 2023/0275197 A1* | 8/2023 | Kim | H01L 33/505 257/91 |

FOREIGN PATENT DOCUMENTS

JP 2020187982 A 11/2020

* cited by examiner

*Primary Examiner* — Tracie Y Green
(74) *Attorney, Agent, or Firm* — ScienBiziP, P.C.

(57) ABSTRACT

A lighting device includes a plurality of light sources arranged side by side in a plane and a wavelength conversion sheet arranged to face a light emitting surface of each of the light sources and converting a wavelength of light from the light sources, in which the wavelength conversion sheet includes a base material having transparency, and a wavelength conversion layer in which a plurality of protrusions containing a wavelength conversion material and having a spherical surface are arranged side by side without gaps on a principal surface of the base material opposite to the light sources.

9 Claims, 12 Drawing Sheets

LIGHTING DEVICE USING WAVELENGTH CONVERSION SHEET, AND DISPLAY DEVICE USING THE SAME

BACKGROUND

1. Field

The present disclosure relates to a lighting device and a display device.

2. Description of the Related Art

In the related art, a backlight device using a mini Light Emitting Diode (LED) or a small LED called a micro-LED is known as a lighting device for irradiating a liquid crystal panel with light. Reducing a size of the LED makes it possible to reduce a thickness of the backlight device, and by performing local dimming driving in which the LED is locally and independently driven, high-precision brightness adjustment and low power consumption become possible.

Japanese Unexamined Patent Application Publication No. 2020-187982 discloses a backlight device that performs local dimming driving of a mini-LED in units of segment regions (division regions obtained by dividing a wiring substrate into a plurality of regions, dimming regions). The backlight device described in Japanese Unexamined Patent Application Publication No. 2020-187982 is a so-called direct type backlight device, and the wiring substrate on which a plurality of mini-LEDs are arranged in a plane, a flat plate-shaped wavelength conversion unit that converts the wavelength of light from the mini-LEDs, a diffuser sheet for diffusing light, and a prism sheet for condensing light are laminated in this order. The wavelength conversion unit is a phosphor that emits yellow light when blue emission light is incident from the mini-LED. With such a configuration, white synthetic light can be emitted from the backlight device in units of segment regions.

Although the backlight device having the above configuration performs local dimming driving, there is a problem that a small amount of light is emitted from the non-driving segment regions where the LED is not driven. The problem is due to the fact that the light emitted from the wavelength conversion unit propagates in the flat plate-shaped wavelength conversion unit along a principal surface direction and reaches the non-driving segment region from the driving segment region where the LED is driven, and a small amount of light is emitted from the non-driving segment region. As a result, the amount of light emitted from the drive segment region is reduced when the LED is partially lit (driven), and brightness of the backlight device is reduced. In addition, since the amount of light emitted from the non-driving segment region increases, brightness contrast of the backlight device decreases.

To cope with this situation, when a minute hole is formed in a principal surface of the wavelength conversion unit and a part of the light emitted from the wavelength conversion unit is emitted from the hole, it is possible to inhibit the light emitted from the wavelength conversion unit from propagating along the principal surface direction. However, in this case, unevenness in brightness tends to occur depending on a positional relationship between the hole and the LED. In addition, since a space occupied by the wavelength conversion unit is reduced by a space for forming the hole, a wavelength conversion function is reduced and, for example, chromaticity changes occur.

The present disclosure has been made in view of the above circumstances, and it is desirable to suppress contrast deterioration and brightness deterioration in local dimming driving.

SUMMARY (1) According to an aspect of the present disclosure, there is provided a lighting device including: a plurality of light sources arranged side by side in a plane; and a wavelength conversion sheet arranged to face a light emitting surface of each of the light sources and converting a wavelength of light from the light sources, in which the wavelength conversion sheet includes a base material having transparency, and a wavelength conversion layer in which a plurality of protrusions containing a wavelength conversion material and having a spherical surface are arranged side by side without gaps on a principal surface of the base material opposite to the light sources.

(2) According to another aspect of the present disclosure, there is provided a display device including: the lighting device; and a display panel that performs display using light from the lighting device.

DESCRIPTION OF THE EMBODIMENTS

First Embodiment

A first embodiment will be described with reference to FIGS. 1 to 8. In the present embodiment, a liquid crystal display device (an example of a display device) 10 including a backlight device 30 (an example of a lighting device) is shown. An X-axis, a Y-axis, and a Z-axis are shown in a part of each drawing, and a direction of each axis is drawn so as to be the same direction in each drawing. In a Z-axis direction, a side of a liquid crystal panel 20 is a front side, and a side of the backlight device 30 is a back side.

Figure 1:
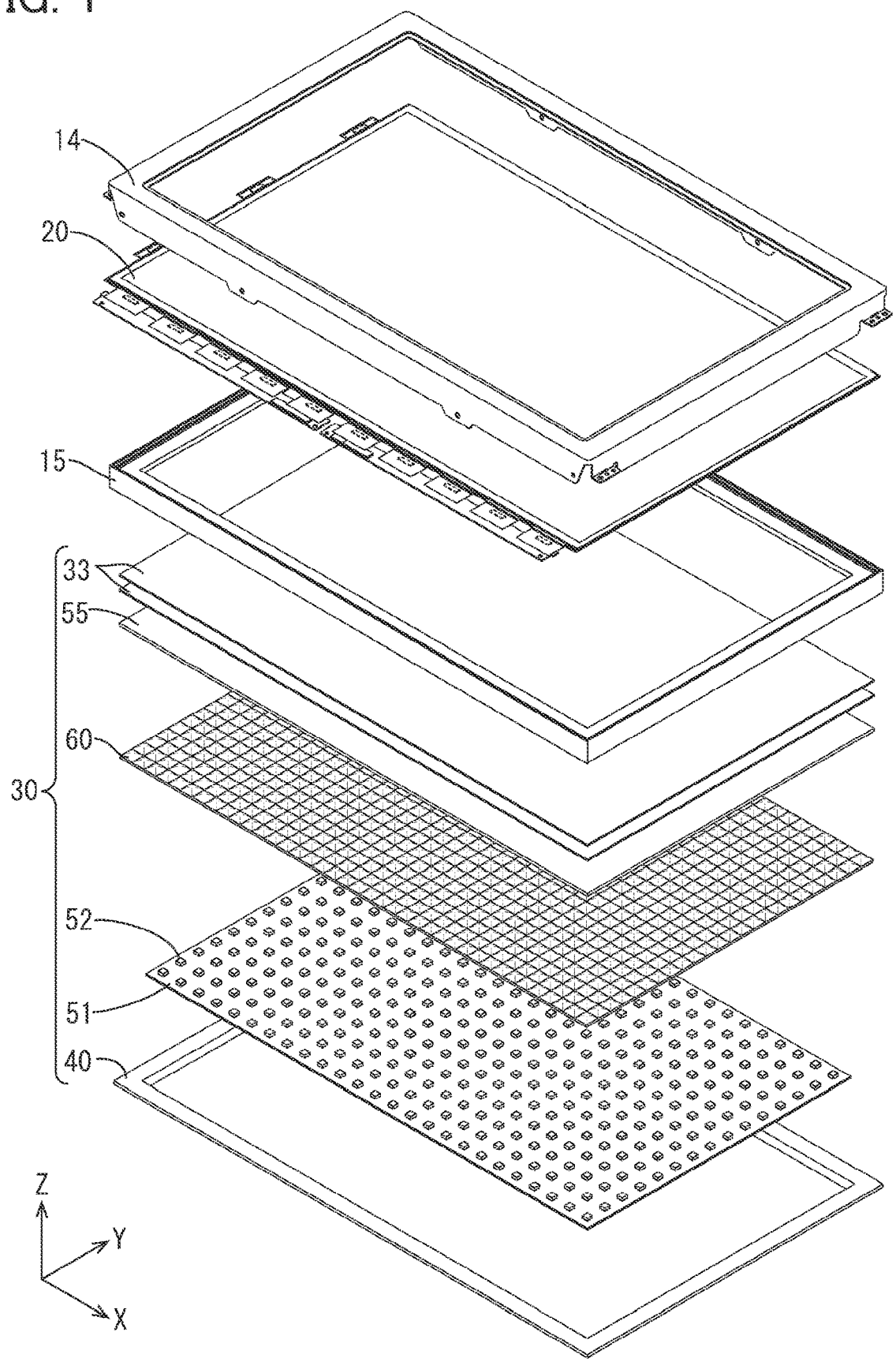
FIG. 1 is an exploded perspective view of a liquid crystal display device according to a first embodiment.

The liquid crystal display device 10 has a horizontally long rectangular shape as a whole, and as shown in FIG. 1, includes the liquid crystal panel (an example of a display panel) 20 which displays an image and the backlight device (an example of a lighting device) 30 which irradiates the liquid crystal panel 20 with light, and the liquid crystal panel 20 and the backlight device 30 are integrally held by a frame-shaped bezel 14 and a frame 15. The liquid crystal panel 20 has a horizontally long rectangular shape as a whole, and is interposed between the bezel 14 and the frame 15 in such a posture that a display surface capable of displaying an image faces the front side. The liquid crystal panel 20 has a configuration in which a pair of transparent (highly light-transmitting) substrates is bonded together with a prescribed gap therebetween, and a liquid crystal layer is sealed between both glass substrates. A polarizer is arranged on the outside of both glass substrates.

Figure 2:
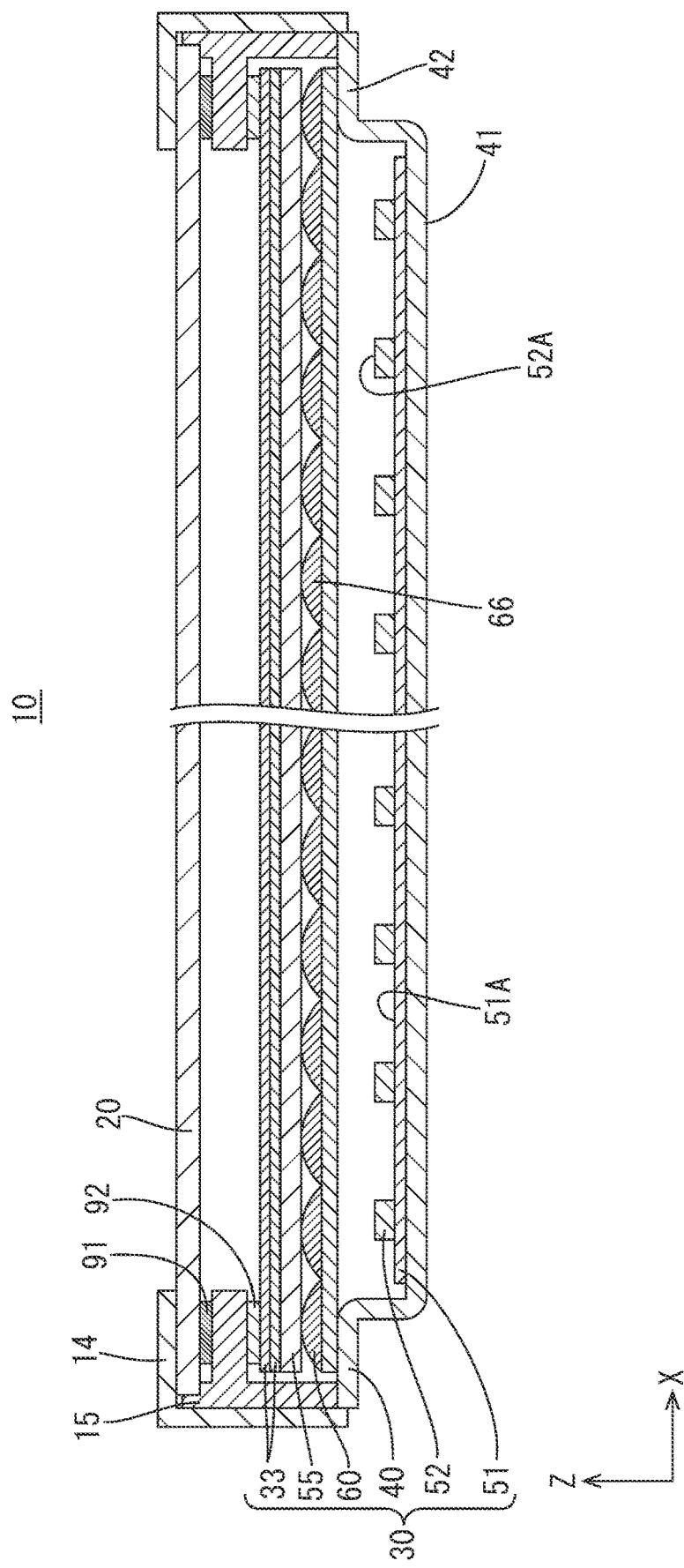
FIG. 2 is a sectional view of the liquid crystal display device.

As shown in FIGS. 1 and 2, the bezel 14 extends along a peripheral edge portion of the front side of the liquid crystal panel 20 and constitutes the appearance of the front side of the liquid crystal display device 10. The bezel 14 is made of highly rigid metal (for example, stainless steel or aluminum-based material) or light-shielding resin. The frame 15 is made of white resin (for example, polycarbonate) having excellent light reflectivity. A black tape-like member 91 is attached between the back side of the liquid crystal panel 20 and the frame 15 for fixing and shielding light.

As shown in FIGS. 1 and 2, the backlight device 30 includes LEDs 52 (an example of a light source) that emit a single color (blue), an LED substrate (an example of a light source substrate) 51 on which the LEDs 52 are mounted, a phosphor sheet 60 (an example of a wavelength conversion sheet), a diffuser plate 55, an optical sheet 33, and a chassis 40. The LEDs 52 are arranged to face the back side (lower side) of the liquid crystal panel 20, and the backlight device 30 is a so-called direct type backlight device. The phosphor sheet 60 transmits a part of the blue light from the LEDs 52 and absorbs another part of the blue light to emit yellow light. The backlight device 30 is configured to emit white synthetic light by using the monochromatic light emitting type LEDs 52 in combination with the phosphor sheet 60. The diffuser plate 55 imparts a diffusion effect to light from the phosphor sheet 60. The optical sheet 33 imparts a prescribed optical effect to the light from the diffuser plate 55 and emits the light toward the liquid crystal panel 20.

As shown in FIGS. 1 and 2, the chassis 40 is shaped like a tray that opens toward the light emitting side (liquid crystal panel 20 side), and the LED substrate 51 is accommodated in a bottom portion 41 of the chassis 40. An outer peripheral edge portion 42 of the chassis 40 protrudes to the front side, and the phosphor sheet 60, the diffuser plate 55, and the optical sheet 33 are placed to be stacked in this order on the outer peripheral edge portion 42. Between the front side of the stacked optical sheets 33 and the frame 15, a fixing tape-like member 92 of white or the like having excellent light reflectivity is attached.

As shown in FIGS. 1 and 2, the diffuser plate 55 is a member thicker (for example, 3 mm thick) than the phosphor sheet 60 and the optical sheet 33, and diffuses the transmitted light. The diffuser plate 55 has a configuration in which a large number of diffusing particles are dispersed in, for example, a base material made of a transparent resin. By providing the diffuser plate 55, even when a distance from the LEDs 52 to the liquid crystal panel 20 is reduced, it becomes easier to suppress brightness unevenness (so-called LED unevenness) according to the arrangement of the LEDs, and thicknesses of the backlight device 30 and the liquid crystal display device 10 can be easily reduced.

As shown in FIGS. 1 and 2, the optical sheet 33 is interposed between the diffuser plate 55 and the liquid crystal panel 20 to impart a prescribed optical effect to the light emitted from the diffuser plate 55. The optical sheet 33 has a thin thickness of, for example, 30 μm and is flexible.

Various types of optical sheets 33 are known, and one type or a plurality of types are appropriately used depending on the application of the liquid crystal display device 10 or the like. In the present embodiment, two lens sheets are used as the optical sheet 33, thereby condensing light emitted from the diffuser plate 55 and emitting the light toward the liquid crystal panel 20. Each lens sheet has a configuration in which a large number of unit lenses extending along one direction are arranged side by side along a direction orthogonal to the extending direction. The two lens sheets are arranged so that the extending directions of the unit lenses are orthogonal to each other.

Specific examples of the optical sheet 33 other than the lens sheet include a brightness enhancement sheet such as a Brightness Enhancement Film (BEF) (registered trademark) series and a Dual Brightness Enhancement Film (DBEF) (registered trademark) series, a turning lens, a diffuser sheet, a prism sheet (optical sheet having a prism or lens shape, excluding brightness enhancement sheet and turning lens), and a dichroic filter. The dichroic filter has a band-pass filter effect, and can improve color reproducibility according to combination with the phosphor sheet 60. Specifically, a filter that reflects blue light and transmits yellow light, a filter that reflects yellow light and transmits blue light, and the like are used as the dichroic filter.

As shown in FIGS. 1 and 2, the LEDs 52 are arranged in a grid pattern (matrix pattern) at substantially equal intervals in the X-axis direction (row direction) and the Y-axis direction (column direction) on the front principal surface (mounting surface 51A) of the rectangular LED substrate 51, respectively. The LED 52 has a rectangular parallelepiped shape, and is of a so-called top light emitting type (top view type) in which a bottom surface is arranged on the mounting surface 51A and a top surface opposite to the bottom surface is the light emitting surface 52A. An optical axis (traveling direction of light with the highest light emission intensity (peak) of emitted light) of the LED 52 is the Z-axis direction.

The LED 52 emits blue light (principal light) within a wavelength range of approximately 420 nm to approximately 500 nm. The LED 52 has a light emitting surface 52A with an area of 5.0 mm$^2$ or less and is a small LED which is smaller than a general LED (with light emitting surface area of approximately 10.0 mm$^2$). The LED 52 is preferably a so-called mini-LED or micro-LED whose light emitting surface 52A has an area of 0.01 mm$^2$ or more and 1.0 mm$^2$ or less. The LED 52 does not contain a phosphor for miniaturization, and has a configuration in which a blue LED element (blue light emitting element) is sealed with a sealing material made of a transparent resin material that does not contain a phosphor. A compact package such as a Chip Scale Package (CSP) or a flip chip type may be used for the package of the LED 52.

The LED substrate 51 has a structure in which a wiring pattern made of a metal film such as copper foil is formed on the surface of a substrate (for example, made of an aluminum-based metal material or an insulating material such as glass epoxy or ceramic) with an insulating layer interposed therebetween. Further, on the mounting surface 51A, preferably, a highly reflective layer is provided in order to increase efficiency of light utilization, or a reflective sheet made of polyester-based or PET-based white resin such as an Enhanced Specular Reflector (ESR) is placed. The highly reflective layer is provided by, for example, applying a highly reflective paint (white paint) or depositing silver (Ag), aluminum (Al), or the like. The LED substrate 51 may be a flexible film-like flexible substrate (Flexible Printed Circuits)(FPC).

Figure 3:
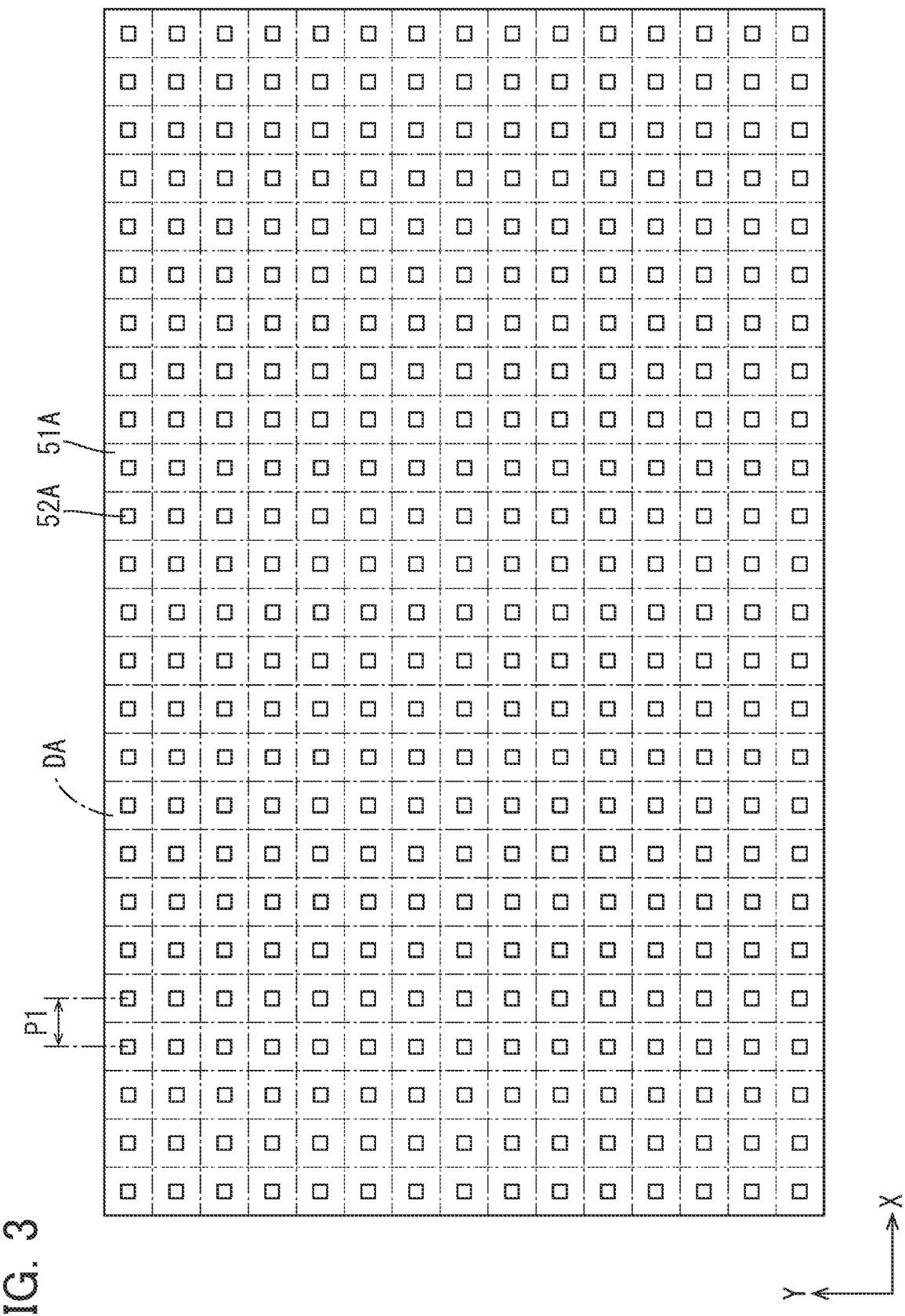
FIG. 3 is a plan view showing a dimming region.

As shown in FIG. 3, the mounting surface 51A of the LED substrate 51 is divided into a plurality of dimming regions (an example of segment region or division region) DA arranged in a matrix without gaps. In the present embodiment, each dimming region DA has a rectangular shape and is divided so that the LED 52 is included one by one in a central portion of the dimming region. A pitch P1 (center-to-center distance between adjacent dimming regions DA) of the dimming regions DA is substantially the same as an arrangement pitch (center-to-center distance between adjacent LEDs 52) of the LEDs 52. The dimming region DA only needs to have a size that includes at least one LED 52, and the pitch P1 of the dimming region DA and the number of LEDs 52 included in each dimming region DA can be changed as appropriate according to a screen size, application, and demanded accuracy of the liquid crystal panel 20.

Drive power is supplied to the LEDs 52 from an external power source through wiring patterns formed in the mounting surface 51A. The wiring pattern and the like of the backlight device 30 are configured so that local dimming driving in which the drive power supplied to the LEDs 52 is independently controlled for each dimming region DA is performed. As a result, an amount of light emitted from the LEDs 52 can be locally adjusted for each dimming region DA, and high-precision brightness adjustment and low power consumption in the backlight device 30 and the liquid crystal display device 10 can be achieved.

Figure 4:
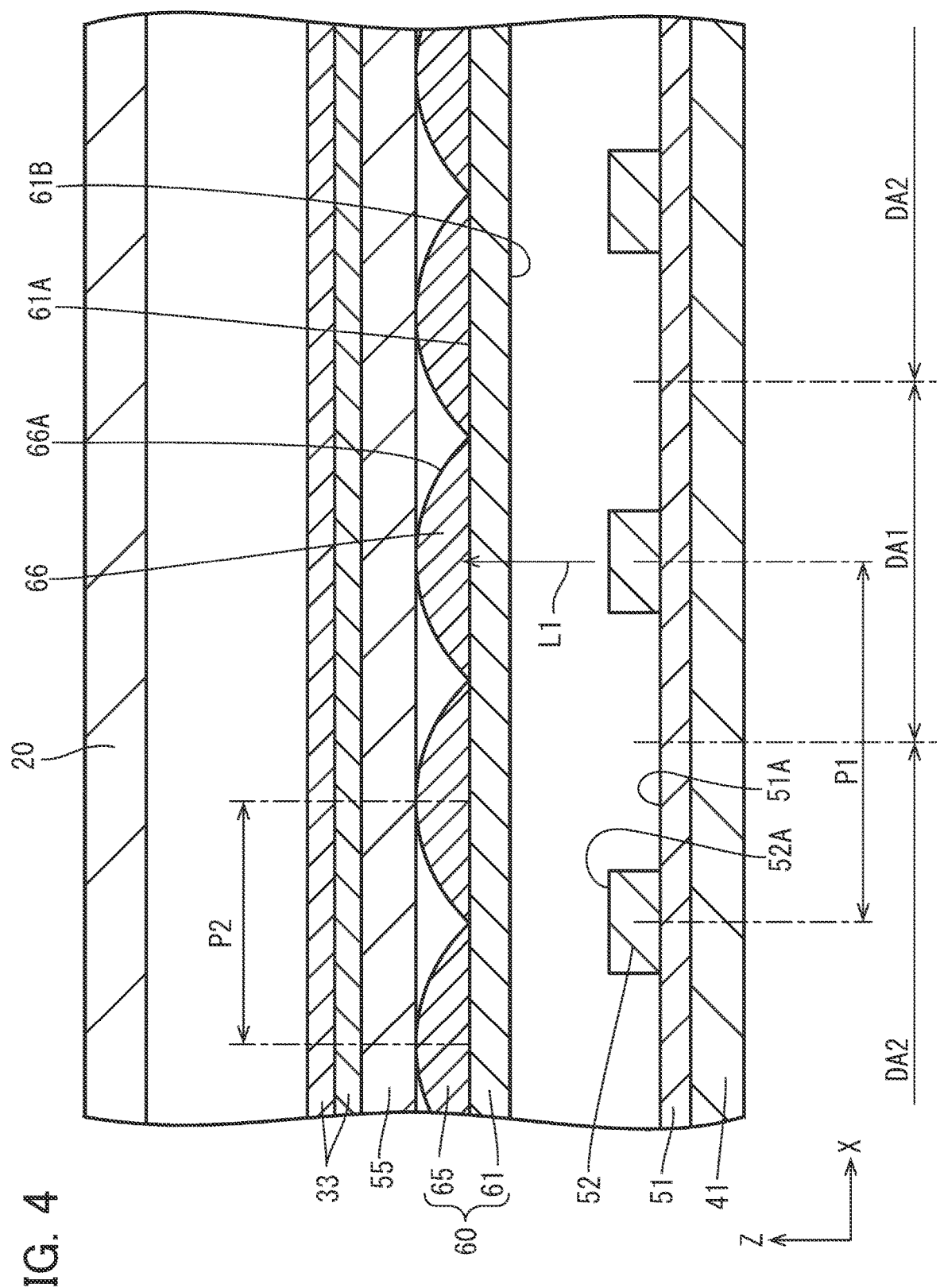
FIG. 4 is an enlarged sectional view of a phosphor sheet and an LED substrate.

The phosphor sheet 60 wavelength-converts the emitted light (principal light) of the LED 52 into longer wavelength light (secondary light). More specifically, the phosphor sheet 60 transmits a part of the blue light from the LEDs 52 and absorbs another part of the blue light to emit yellow light. As shown in FIG. 4, the phosphor sheet 60 includes a base material 61 and a wavelength conversion layer 65 provided on the front principal surface (light emitting-side principal surface 61A) of the pair of principal surfaces of the base material 61. The phosphor sheet 60 is arranged so that a normal direction of the principal surface of the base material 61 coincides with the optical axis of the LED 52. The base material 61 is made of highly transparent resin (for example, polyester resin or acrylic resin) and supports the wavelength conversion layer 65. A plurality of protrusions 66 containing a phosphor material are formed in the wavelength conversion layer 65 so as to be arranged without gaps.

Figure 5:
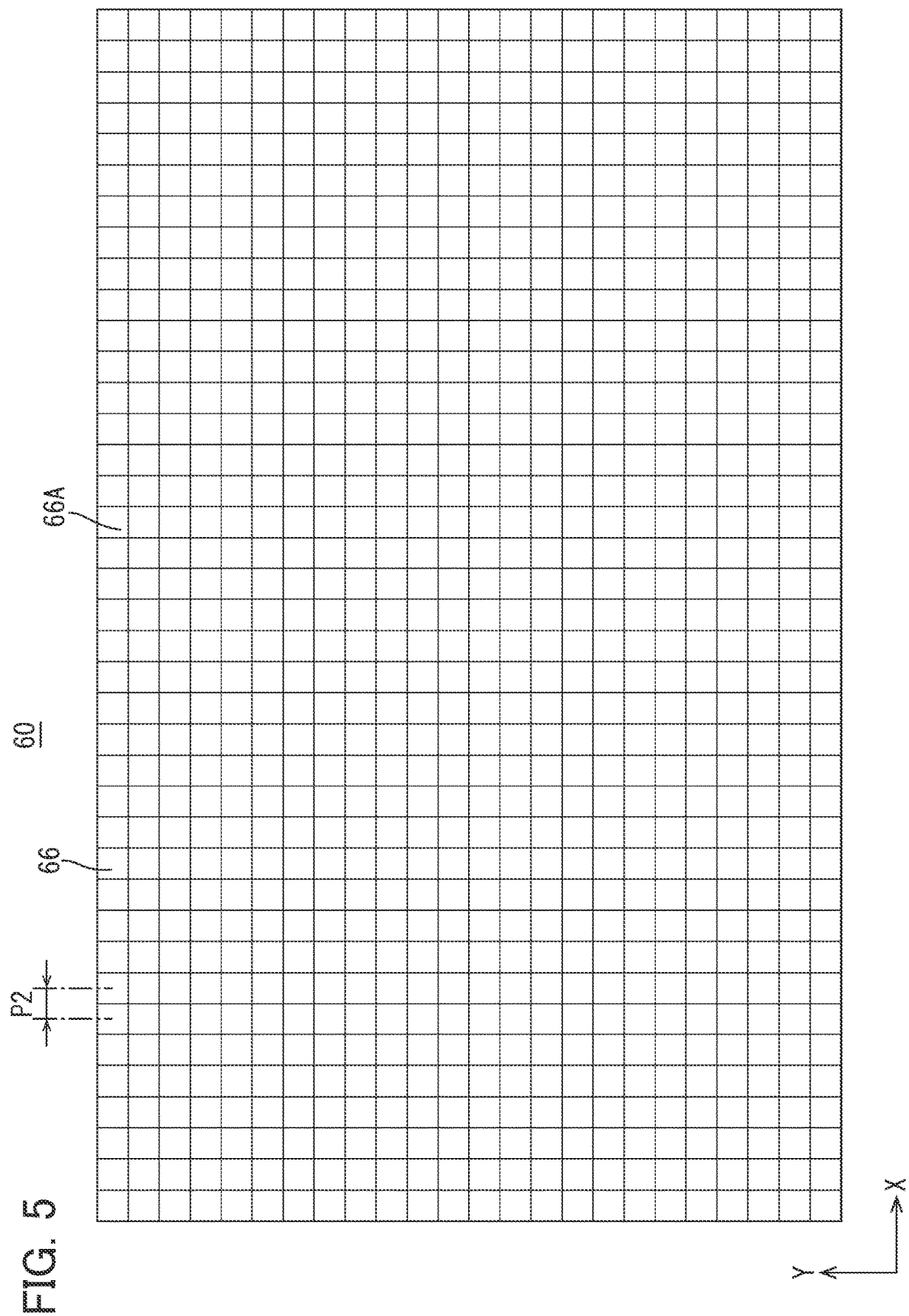
FIG. 5 is a plan view of the phosphor sheet.
Figure 6:
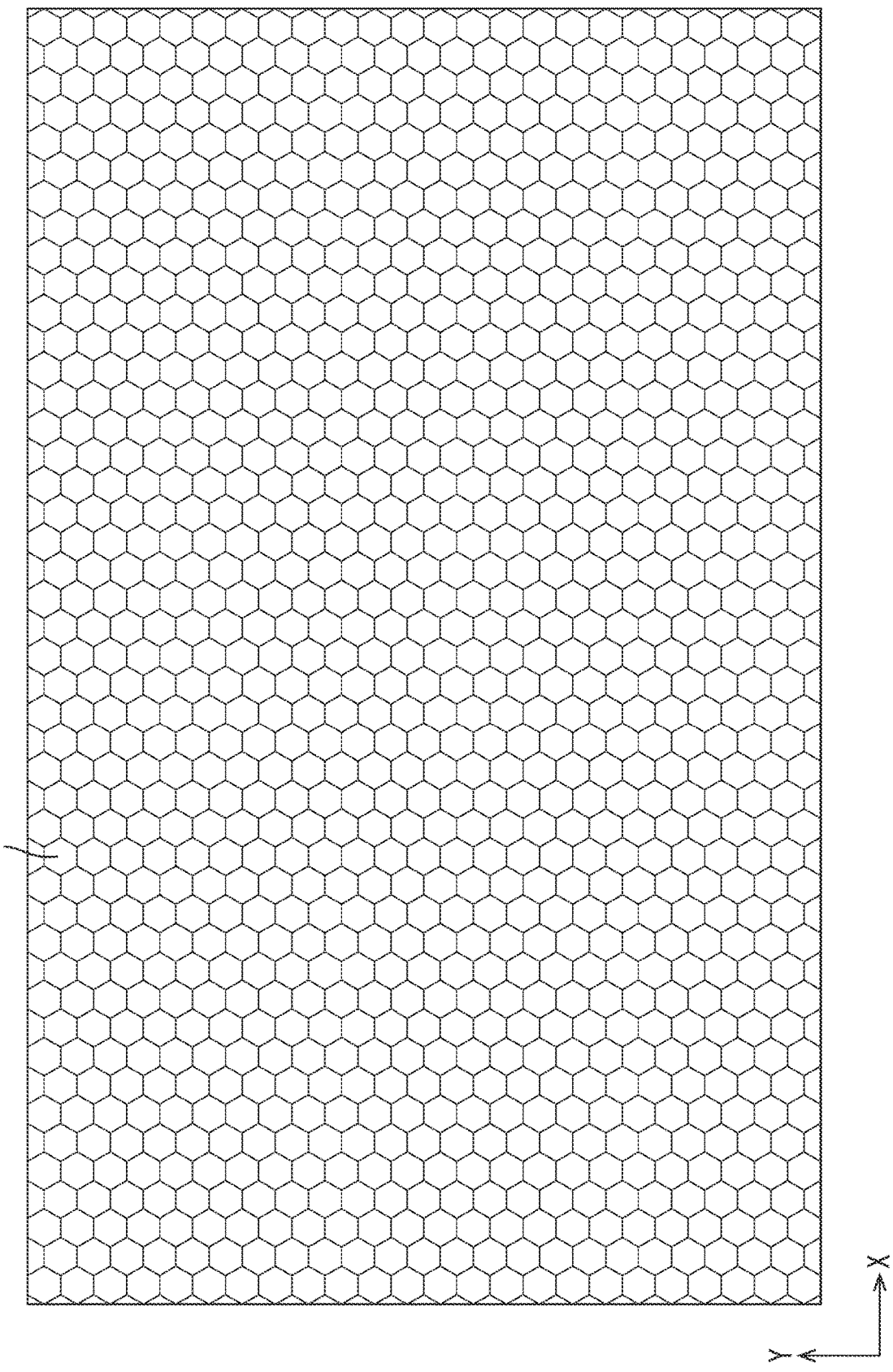
FIG. 6 is a plan view of a phosphor sheet according to a first modification.

As shown in FIG. 4, the protrusion 66 is formed so as to protrude from the light emitting-side principal surface 61A of the base material 61 so as to have a semi-elliptical section, and a front surface 66A (a surface on a side opposite to the LED 52) which is a light emitting surface has a spherical shape. Moreover, as shown in FIG. 5, the protrusion 66 has a rectangular planar shape (an example of a quadrangle or a polygon). The planar shape of the protrusions 66 is not limited to a rectangular shape as long as it is a shape that can be arranged on the mounting surface 51A without gaps, and for example, the planar shape may be hexagonal (another example of a polygonal shape) like a protrusion 166 of a phosphor sheet 160 according to a first modification of FIG. 6.

The protrusion 66 contains an acrylic resin used as a binder resin, and a phosphor (an example of a phosphor material or a wavelength conversion material) mixed in the binder resin in a dispersed mode. The binder resin has optical transparency and adhesiveness to the base material 61. The type of phosphor is not limited as long as it can convert the wavelength of principal light included in a prescribed wavelength range into secondary light included in a different wavelength range, and for example, a quantum dot phosphor, an inorganic phosphor, an organic phosphor, or the like is used. In the present embodiment, a quantum dot phosphor is used, which absorbs and excites blue light from the LED 52 and in which a green quantum dot phosphor that emits green light in the wavelength range from about 500 nm to about 570 nm and a red quantum dot phosphor that emits red light in the wavelength range from about 600 nm to about 780 nm are mixed in a prescribed ratio. The quantum dot phosphor of each color are dispersed and blended in the acrylic resin forming the protrusion 66 so as to be substantially uniform.

Next, action and effect of the phosphor sheet 60 having the above configuration will be described. As indicated by an arrow L1 in FIG. 4, the blue light from the LED 52 travels along the Z-axis direction which is the optical axis, is incident on the phosphor sheet 60, and is transmitted through the base material 61 in the Z-axis direction as it is and incident on the protrusion 66. Then, yellow light is emitted in each direction by the phosphor dispersed in the protrusion 66, as indicated by arrows L2, L3 and L4 in FIG. 7. Since the light emitting surface 66A is spherical, an incident angle of the yellow light reaching the light emitting surface 66A with respect to the light emitting surface 66A does not easily exceed the critical angle. As a result, as indicated by the arrow L2 in FIG. 7, most of the light that reaches the light emitting surface 66A is not totally reflected by the light emitting surface 66A which is an interface with an air layer, and is emitted to the outside (air layer in the gap between the light emitting surface 66A and the diffuser plate 55) of the light emitting surface 66A.

When the wavelength conversion layer has a flat plate shape and does not have the plurality of protrusions 66 as in the related art, since the light emitting surface on the front side is planar, the yellow light emitted by the phosphor has an incident angle exceeding the critical angle with respect to the light emitting surface, which is the interface with the air layer, and is likely to be totally reflected. As a result, the yellow light in the wavelength conversion layer easily propagates along the principal surface direction (X-Y surface direction) of the phosphor sheet 60. On the other hand, according to the phosphor sheet 60 according to the present embodiment, the light emitting surface 66A of the protrusion 66 forming the wavelength conversion layer 65 is spherical. Accordingly, the light incident on the phosphor sheet 60 is more likely to be emitted from the light emitting surface 66A, and propagation in the principal surface direction of the phosphor sheet 60 is suppressed.

According to the above-described configuration, when only a part of the LEDs 52 are driven (lighted) by local dimming driving, it is possible to inhibit the light of the dimming region (driving dimming region) DA1 including the LEDs 52 from propagating to another dimming region (non-driving dimming region) DA2 where the LED 52 is not driven and being emitted from the non-driving dimming region DA2. Accordingly, it is possible to inhibit the amount of light emitted from the driving dimming region DA1 from decreasing and the amount of light emitted from the non-driving dimming region DA2 from increasing. As a result, it is possible to inhibit the brightness (as a result, brightness of liquid crystal panel 20) or a brightness contrast of the backlight device 30 during partial lighting from decreasing.

Figure 7:
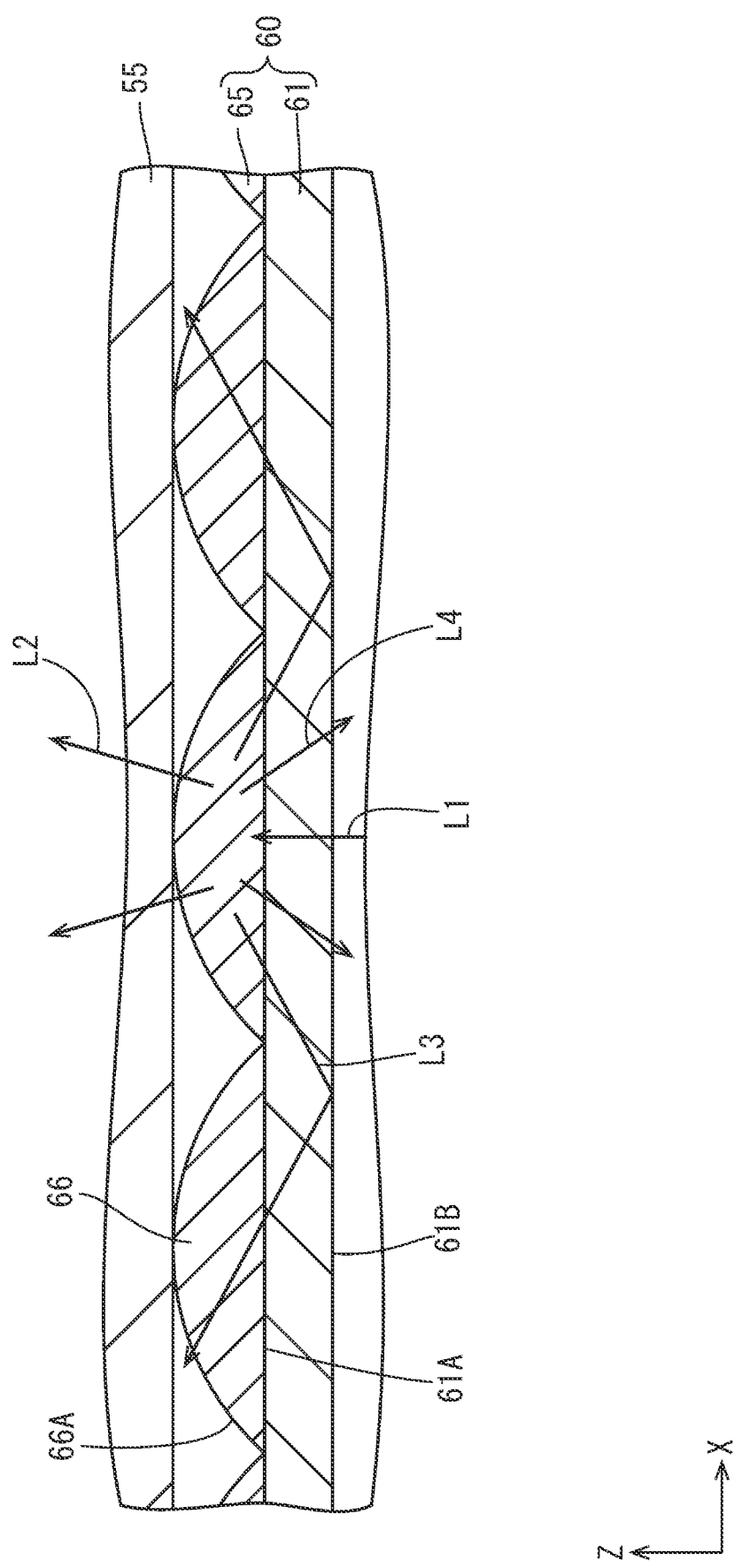
FIG. 7 is an enlarged sectional view of the phosphor sheet.

Moreover, a part of the yellow light emitted from the inside of the protrusion 66 is incident on the base material 61 again as indicated by arrows L3 and L4 in FIG. 7. Then, as indicated by the arrow L3, a part of the yellow light incident on the base material 61 again becomes propagating light which is totally reflected by the back principal surface (the principal surface opposite to the wavelength conversion layer 65, light incident side principal surface 61B) of the base material 61 which is the interface with the air layer and propagates in the principal surface direction of the phosphor sheet 60. As indicated by an arrow L4, another part of the yellow light incident on the base material 61 again transmits the base material 61 without being totally reflected by the light incident side principal surface 61B and is emitted to the outside of the base material 61.

In the present embodiment, in order to reduce a propagation distance of the propagating light (arrow L3 in FIG. 7) that is propagated after being totally reflected by the light incident side principal surface 61B, as shown in FIG. 4, a pitch P2 (center-to-center distance between adjacent protrusions 66) of the protrusion 66 is equal to or less than the pitch P1 of the dimming region DA. As the pitch D2 of the protrusions 66 decreases, the distance that the propagating light reaches decreases, thereby enhancing the effect of suppressing the propagating light. Meanwhile, when the pitch P2 of the protrusions 66 decreases, manufacturing difficulty of the protrusions 66 increases. Therefore, by setting the pitch P2 of the protrusions 66 to be at least equal to or less than the pitch P1 of the dimming region DA, the effect of suppressing the propagating light can be effectively enhanced. A curvature radius of the light emitting surface 66A of the protrusion 66 is determined by the height (protrusion height) and the pitch P2 of the protrusion 66, and as the pitch P2 decreases, the curvature radius of the light emitting surface 66A decreases.

Moreover, a thickness L61 of the base material 61 is preferably 20 µm or more and 300 µm or less. As shown in a comparison between FIGS. 7 and 8, the propagation distance of the propagating light (arrow L3 in FIG. 7) propagated after being totally reflected by the light incident side principal surface 61B decreases as the thickness L61 of the base material 61 decreases, and thus, the effect of suppressing propagating light can be enhanced. On the other hand, when the thickness L61 of the base material 61 is less than 20 µm, it becomes difficult to form the wavelength conversion layer 65 on the base material 61 in terms of manufacturing, and the difficulty of handling the phosphor sheet 60 during assembly also increases. Therefore, by setting the thickness L61 of the base material 61 to 20 µm or more and 300 µm or less, the effect of suppressing the propagating light can be effectively enhanced.

Second Embodiment

Figure 9:
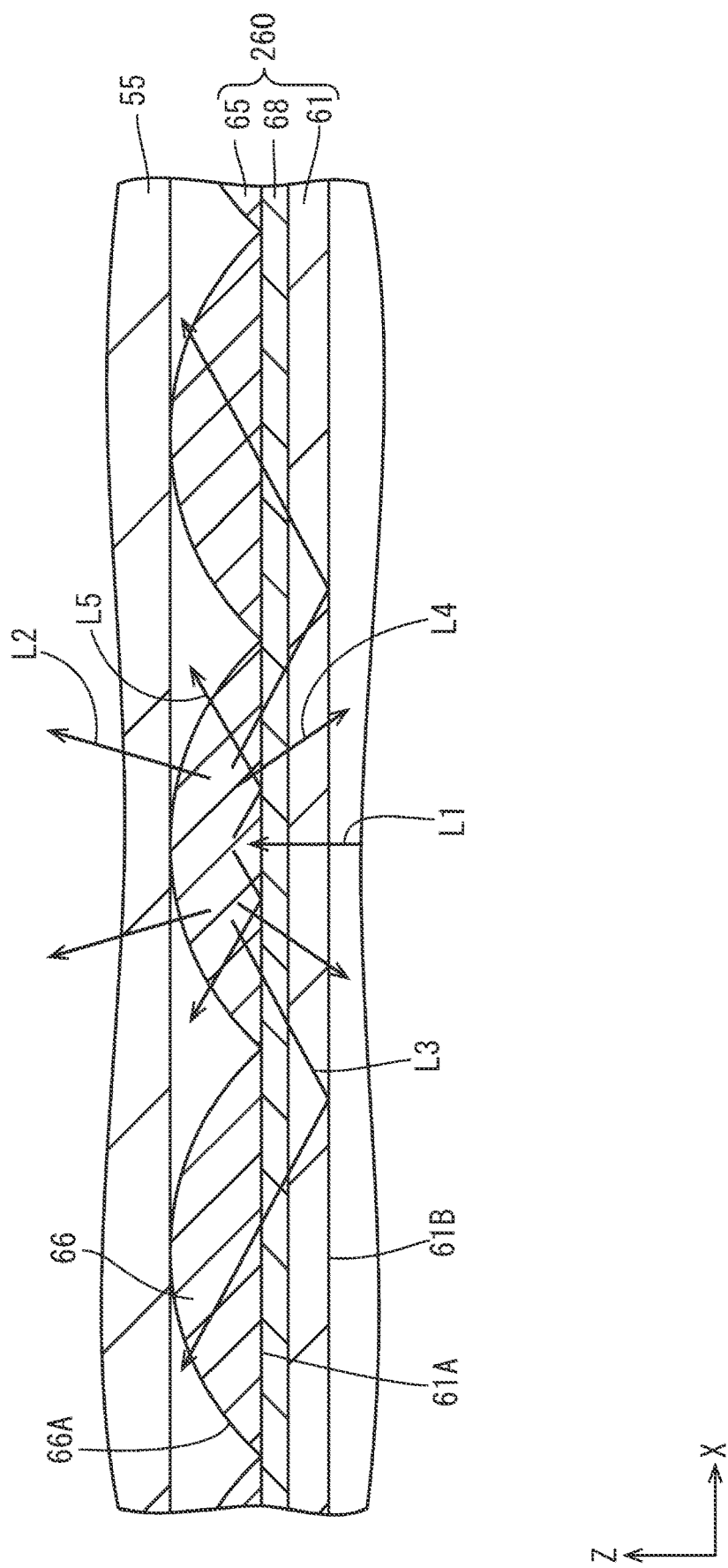
FIG. 9 is an enlarged sectional view of a phosphor sheet according to a second embodiment.

A liquid crystal display device 110 according to a second embodiment will be described. The liquid crystal display device 110 differs from the first embodiment and the first modification in the configuration of the phosphor sheet 260 as shown in FIG. 9. In the second embodiment, redundant descriptions of the same configurations, actions, and effects as those of the first embodiment and the first modification will be omitted.

As shown in FIG. 9, the phosphor sheet 260 according to the present embodiment includes a low-refractive-index layer 68 having a refractive index lower than a refractive index of each of the base material 61 and the wavelength conversion layer 65 between the base material 61 and the wavelength conversion layer 65. In this way, the yellow light emitted by the phosphor dispersed in the protrusions 66 of the wavelength conversion layer 65 travels as indicated by the arrows L2, L3, and L4 in FIG. 7 as described above, a part of the yellow light is totally reflected at the interface with the low-refractive-index layer 68 as indicated by an arrow L5 in FIG. 9. Accordingly, the yellow light emitted from the inside of the protrusion 66 is less likely to propagate to the adjacent protrusion 66, and in the local dimming drive, it is possible to inhibit the amount of light emitted from the driving dimming region DA1 from decreasing and the amount of light emitted from the non-driving dimming region DA2 from increasing. As a result, it is possible to inhibit the brightness (as a result, brightness of liquid crystal panel 20) or the brightness contrast of the backlight device 30 during partial lighting from decreasing.

The effect of total reflection described above increases as the refractive index of the low-refractive-index layer 68 decreases. In addition, similar to the effect of thinning the base material 61 described above, as the thickness of the low-refractive-index layer 68 decreases, a distance of a part of the yellow light emitted from the inside of the protrusions 66 propagating in the principal surface direction of the phosphor sheet 60 decreases, and thus, the effect of suppressing propagating light can be enhanced.

Third Embodiment

Figure 10:
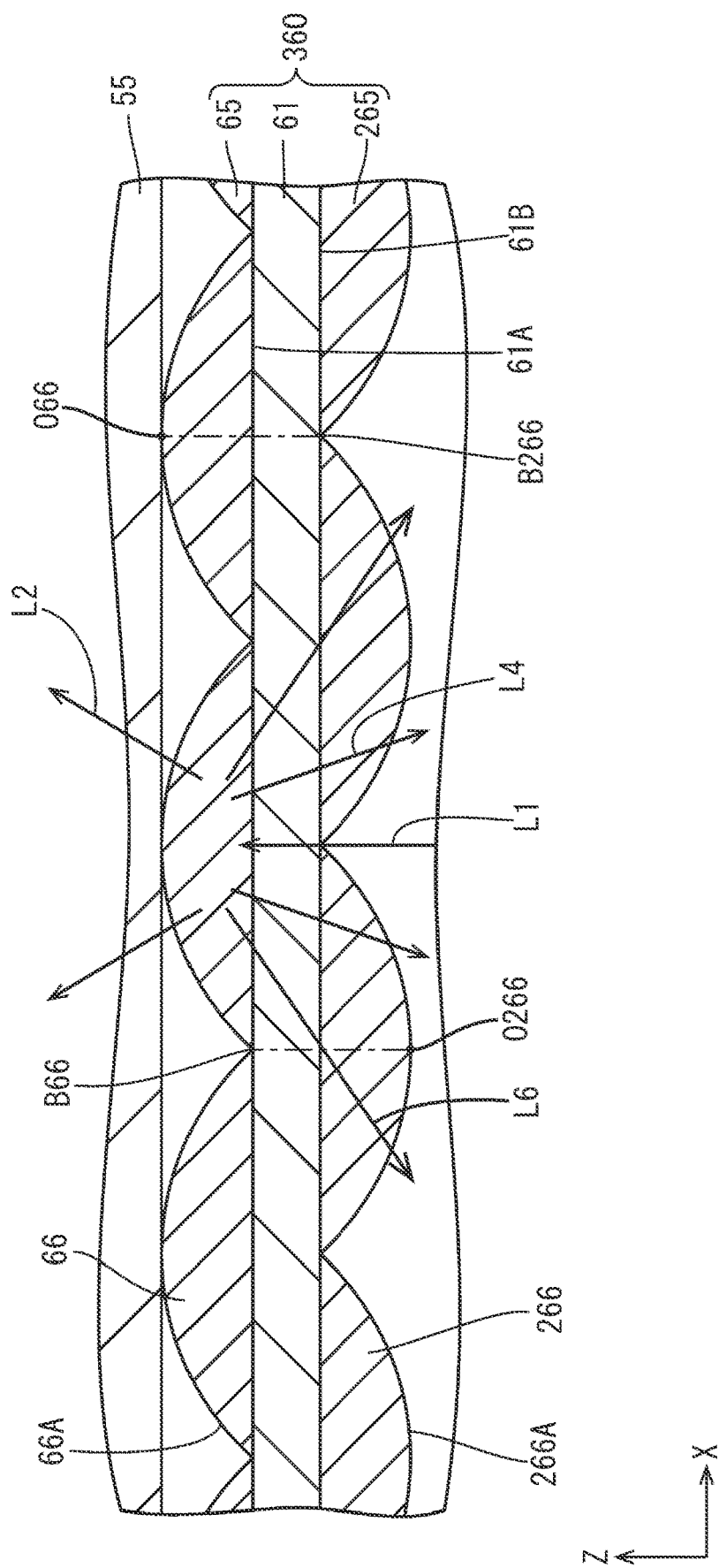
FIG. 10 is an enlarged sectional view of a phosphor sheet according to a third embodiment.
Figure 11:
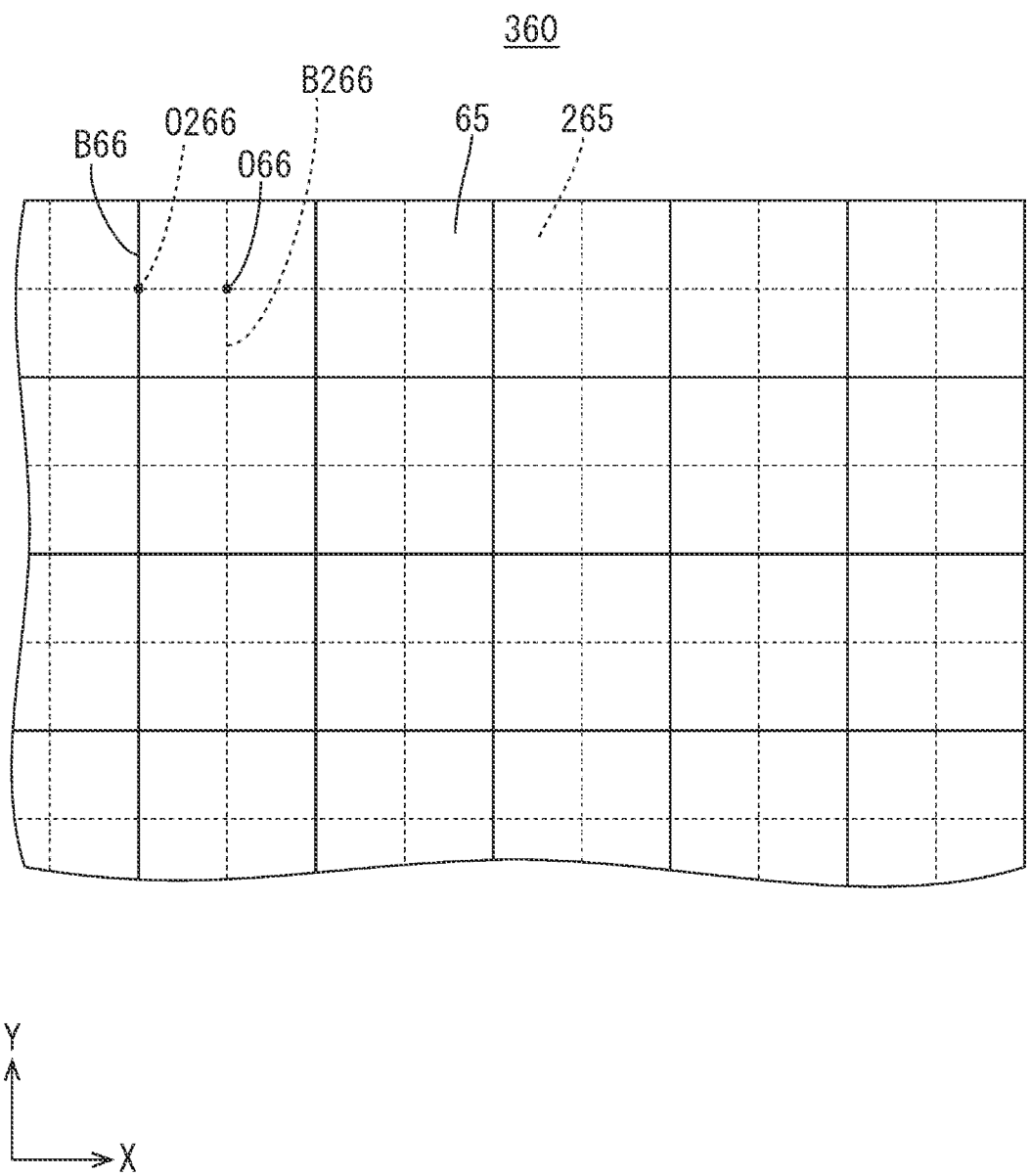
FIG. 11 is a partial plan view of the phosphor sheet according to the third embodiment.

A liquid crystal display device 210 according to a third embodiment will be described. As shown in FIGS. 10 and 11, in the liquid crystal display device 210, the configuration of the phosphor sheet 360 is different from those of the first embodiment, the first modification, and the second embodiment. In the third embodiment, duplicate descriptions of the same configurations, actions and effects as those of the first embodiment, the first modification, and the second embodiment will be omitted.

In the phosphor sheet 360 according to the present embodiment, as shown in FIG. 10, the wavelength conversion layer is provided on each of both (light emitting-side principal surface 61A and the light incident side principal surface 61B) of the pair of principal surfaces of the base material 61, and the phosphor sheet 360 has a first wavelength conversion layer 65 provided on the light emitting-side principal surface 61A and a second wavelength conversion layer 265 provided on the light incident side principal surface 61B. A plurality of protrusions 66 and 266 are formed in each of the wavelength conversion layers 65 and 265, and shape and size of the protrusion 266 of the second wavelength conversion layer 265 follow those of the protrusion 66 of the first wavelength conversion layer 65.

Figure 8:
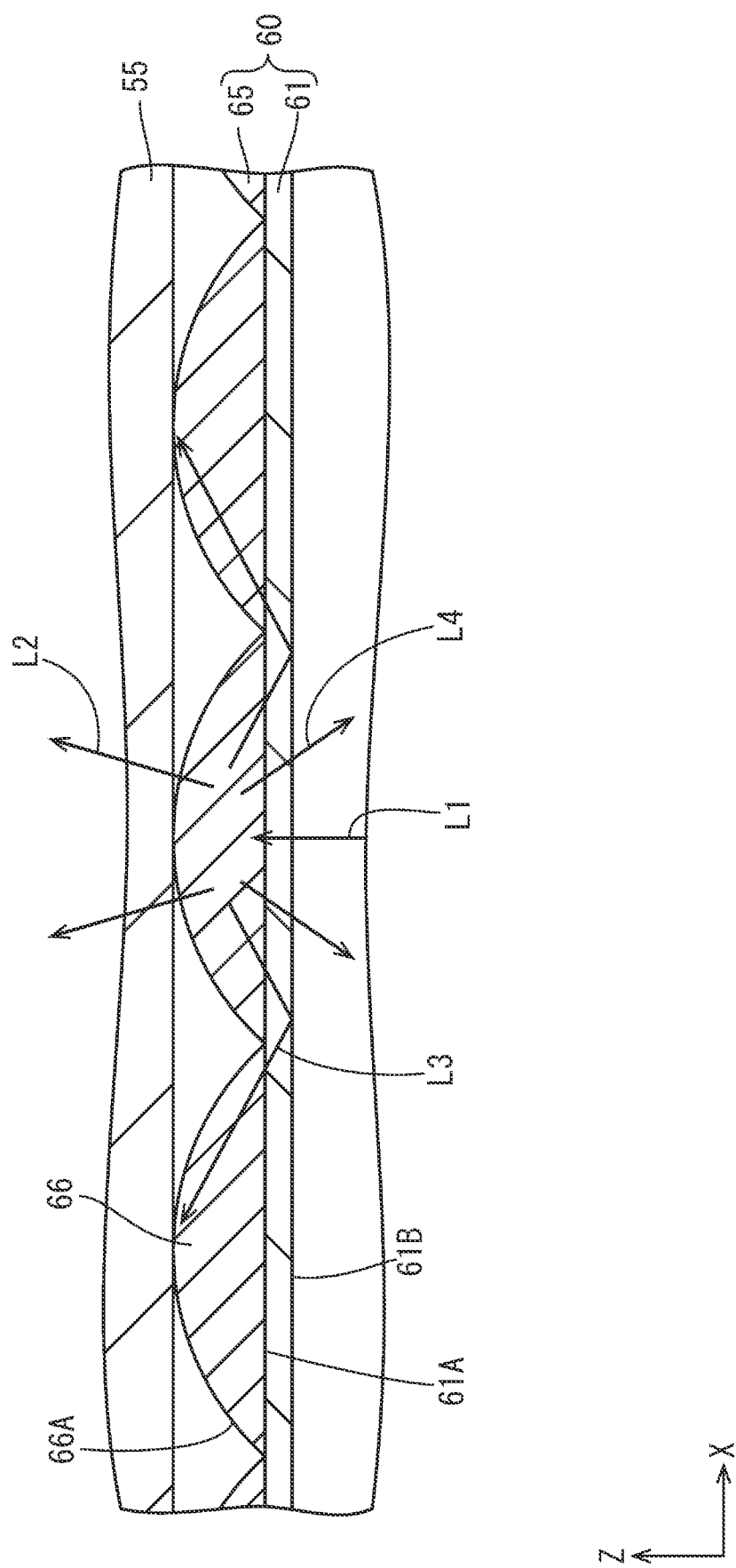
FIG. 8 is a sectional view showing an effect of thinning a base material.

In the present embodiment, by providing the second wavelength conversion layer 265, a part of the yellow light emitted from the inside of the first wavelength conversion layer 65 is not totally reflected by the light incident side principal surface 61B as indicated by the arrow L3 in FIG. 7, the light is transmitted through the base material 61 and is incident on the second wavelength conversion layer 265 as indicated by the arrow L6 in FIG. 8. Since an incident angle with respect to a spherical surface 266A of the protrusion 266 does not easily exceed the critical angle, most of the yellow light incident on the second wavelength conversion layer 265 is not totally reflected by the spherical surface 266A which is the interface with the air layer and is emitted to the outside (air layer) of the spherical surface 266A. The yellow light emitted from the spherical surface 266A is reflected by the highly reflective layer of the mounting surface 51A of the LED substrate 51 and returns to the phosphor sheet 360. Since the light returned to the phosphor sheet 360 is the yellow light, the light is transmitted through the phosphor sheet 360 in the traveling direction without being subjected to a wavelength conversion function by the phosphor, and is emitted from the light emitting surface 66A.

By doing so, the light incident side principal surface 61B of the flat base material 61 does not form the interface with the air layer. As a result, the effect of suppressing the light (arrow L3 in FIG. 7) totally reflected by the light incident side principal surface 61B and suppressing the propagating light propagating in the principal surface direction of the phosphor sheet 360 can be enhanced. In addition, the light utilization efficiency can be enhanced.

Further, as shown in FIGS. 10 and 11, a center O66 of the protrusion 66 of the first wavelength conversion layer 65 in a plan view and a center O266 of the protrusion 266 of the second wavelength conversion layer 265 in a plan view are located at different positions. More specifically, the center O66 of the protrusion 66 overlaps a boundary B266 between adjacent protrusions 266, and the center O266 of the protrusion 266 overlaps a boundary B66 between adjacent protrusions 66.

In this way, as shown in FIG. 10, a thick portion of the first wavelength conversion layer 65 and a thin portion of the second wavelength conversion layer 265 overlap each other in the Z-axis direction (film thickness direction), and a thin portion of the first wavelength conversion layer 65 and a thick portion of the second wavelength conversion layer 265 overlap each other in the film thickness direction. Thereby, a sum of the film thicknesses of the wavelength conversion layers 65 and 265 is made uniform in the plane. By making the film thickness of the wavelength conversion layer uniform for the phosphor sheet 360 as a whole, it is possible to suppress the brightness unevenness and chromaticity unevenness in the plane.

OTHER EMBODIMENTS

The present disclosure is not limited to the embodiments explained by the above description and drawings, and the following embodiments are also included in the technical scope of the present disclosure.

(1) The LED 52 does not have to be a small LED whose light emitting surface 52A has an area of 5.0 mm$^2$ or less, and the present disclosure can also be applied to a lighting device using a larger LED. The wavelength range of the principal light emitted by the LED 52 is not limited, and a single color other than blue may be emitted. In that case, the phosphor material of the phosphor sheet 60 may be appropriately selected according to the wavelength range emitted by the LEDs 52.

(2) The bezel 14 and the frame 15 need only hold at least a part of the liquid crystal panel 20 and the backlight device 30, and may be non-frame-shaped. Moreover, both the bezel 14 and the frame 15 may not be provided, and only one of the bezel 14 and the frame 15 may hold the liquid crystal panel 20 and the backlight device 30.

(3) The optical sheets 33 and 133, the diffuser plate 55, and the phosphor sheets 60, 160, 260, and 360 may be supported not by the outer peripheral edge portion 42 of the chassis 40 but by another structure.

Figure 12:
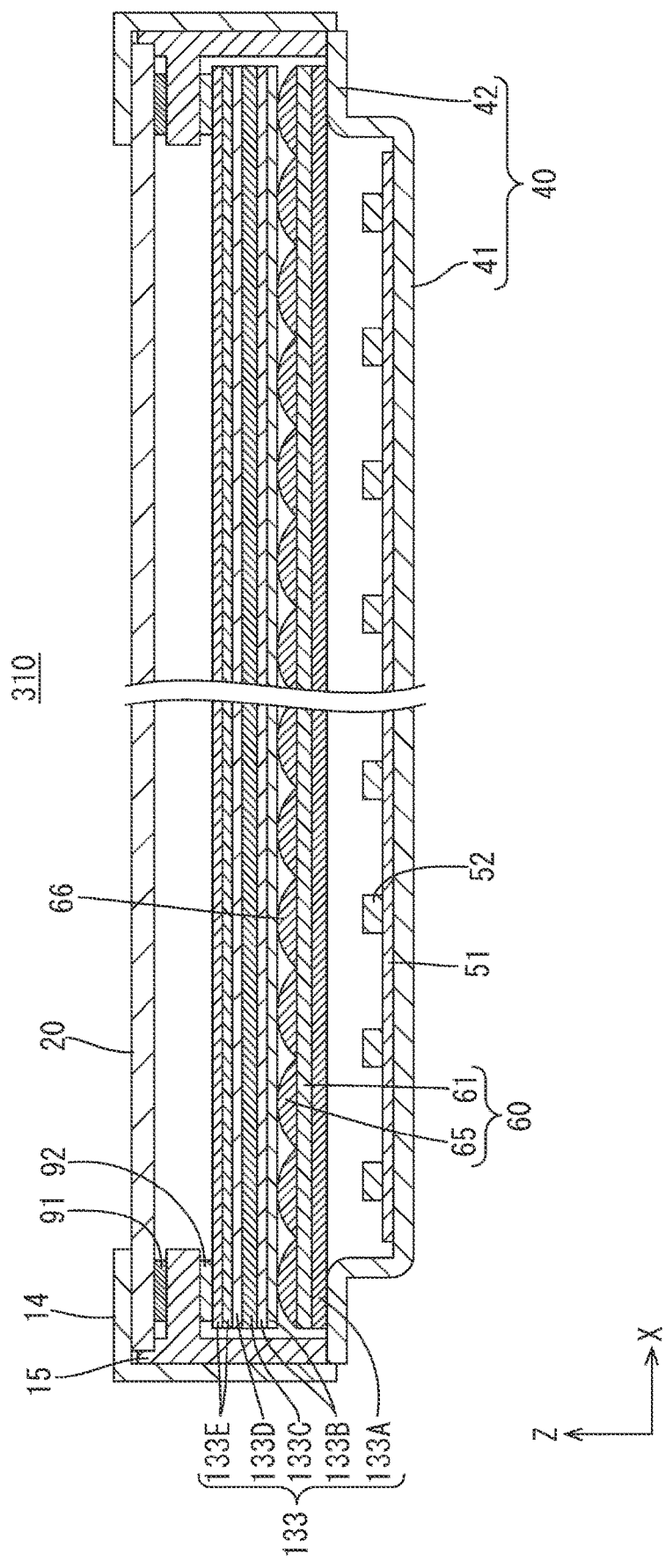
FIG. 12 is a sectional view of a liquid crystal display device according to another embodiment.

(4) The optical members such as the diffuser plate 55 and the optical sheet 33 that impart an optical effect can be changed as appropriate according to the application, and may be configured as shown in FIG. 12, for example. In a liquid crystal display device 310 shown in FIG. 12, a plurality of optical sheets 133 are disposed to be interposed between the phosphor sheet 60 and the LEDs 52 and between the phosphor sheet 60 and the liquid crystal panel 20. More specifically, a dichroic filter 133A, the phosphor sheet 60, two prism sheet 133B, a dichroic filter 133C, a diffuser sheet 133D, and two lens sheets 133E are placed to be stacked in this order on the outer peripheral edge portion 42 of the chassis 40.

(5) The liquid crystal panel 20, the backlight device 30, and the liquid crystal display devices 10, 110, 210, and 310 may be non-rectangular.

The present disclosure contains subject matter related to that disclosed in Japanese Priority Patent Application JP 2022-055288 filed in the Japan Patent Office on Mar. 30, 2022, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof

What is claimed is:
1. A lighting device comprising:
   a plurality of light sources arranged side by side in a plane; and
   a wavelength conversion sheet arranged to face a light emitting surface of each of the plurality of light sources and converting a wavelength of light from the plurality of light sources,
   wherein the wavelength conversion sheet includes:
      a base material having transparency, and
      a wavelength conversion layer, in which a plurality of protrusions containing a wavelength conversion material and having a spherical surface, is arranged side by side without gaps on a principal surface of the base material opposite the plurality of light sources,
   the wavelength conversion layer is provided on each of a pair of principal surfaces of the base material, and
   centers of the plurality of protrusions in a plan view are arranged at different positions in the wavelength conversion layer provided on one of the pair of principal surfaces and the wavelength conversion layer provided on another one of the pair of principal surfaces.
2. The lighting device according to claim 1, further comprising:
   a light source substrate having a mounting surface on which the plurality of light sources is arranged side by side,
   wherein the mounting surface is divided into a plurality of division regions each having a size and containing at least one of the plurality of light sources,
   the plurality of light sources is configured to be independently driven for each of the plurality of division regions, and
   a center-to-center distance between adjacent protrusions of the plurality of protrusions is equal to or less than a center-to-center distance between adjacent division regions of the plurality of division regions.
3. The lighting device according to claim 2,
   wherein each of the plurality of division regions has a rectangular shape and is divided such that one of the plurality of light sources is included in a central portion of each of the plurality of division regions, and the center-to-center distance between the adjacent division regions is substantially equal to a center-to-center distance between adjacent light sources of the plurality of light sources.

4. The lighting device according to claim 1,
wherein a thickness of the base material is 20 μm or more and 300 μm or less.

5. The lighting device according to claim 1,
wherein the wavelength conversion sheet further includes a low-refractive-index layer, having a refractive index lower than a refractive index of each of the base material and the wavelength conversion layer, between the base material and the wavelength conversion layer.

6. The lighting device according to claim 1,
wherein each of the plurality of protrusions has a semi-elliptical section and a polygonal shape in the plan view.

7. A lighting device comprising: according to claim 1,
a plurality of light sources arranged side by side in a plane; and
a wavelength conversion sheet arranged to face a light emitting surface of each of the plurality of light sources and converting a wavelength of light from the plurality of light sources,
wherein the wavelength conversion sheet includes:
   a base material having transparency, and
   a wavelength conversion layer, in which a plurality of protrusions containing a wavelength conversion material and having a spherical surface, is arranged side by side without gaps on a principal surface of the base material opposite the plurality of light sources, and
   each of the plurality of light sources is a monochromatic light emitting type light emitting diode (LED) having an area of the light emitting surface of 0.01 mm$^2$ or more and 1.0 mm$^2$ or less, and the wavelength conversion sheet is a phosphor sheet having a dispersed and blended phosphor material.

8. A display device comprising:
the lighting device according to claim 1; and
a display panel that performs display using light from the lighting device.

9. The display device according to claim 8,
wherein the display panel is a liquid crystal panel having a liquid crystal layer.

* * * * *